(12) United States Patent
Jeong et al.

(10) Patent No.: US 8,420,287 B2
(45) Date of Patent: Apr. 16, 2013

(54) POSITIVE PHOTOSENSITIVE RESIN COMPOSITION

(75) Inventors: Ji-Young Jeong, Uiwang-si (KR);
Min-Kook Chung, Uiwang-si (KR);
Hyun-Yong Cho, Uiwang-si (KR);
Doo-Young Jung, Uiwang-si (KR);
Jong-Hwa Lee, Uiwang-si (KR);
Yong-Sik Yoo, Uiwang-si (KR);
Jeong-Woo Lee, Uiwang-si (KR);
Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 219 days.

(21) Appl. No.: 12/834,933

(22) Filed: Jul. 13, 2010

(65) Prior Publication Data
US 2011/0111346 A1 May 12, 2011

(30) Foreign Application Priority Data
Nov. 10, 2009 (KR) .................. 10-2009-0108273

(51) Int. Cl.
*G03F 7/023* (2006.01)

(52) U.S. Cl.
USPC ........ 430/191; 430/192; 430/193; 430/270.1; 430/281.1; 430/906

(58) Field of Classification Search ............... 430/270.1, 430/906, 191, 192, 193, 281.1
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore | |
| 3,669,658 A | 6/1972 | Yonezawa et al. | |
| 4,289,699 A | 9/1981 | Oba et al. | |
| 4,400,521 A | 8/1983 | Oba et al. | |
| 5,077,378 A | 12/1991 | Mueller et al. | |
| 6,143,467 A | 11/2000 | Hsu et al. | |
| 6,214,516 B1 | 4/2001 | Waterson et al. | |
| 6,927,013 B2 | 8/2005 | Banba et al. | |
| 7,101,652 B2 | 9/2006 | Naiini et al. | |
| 7,129,011 B2 * | 10/2006 | Rushkin et al. ................. 430/18 |
| 7,238,455 B2 | 7/2007 | Banba et al. | |
| 7,361,445 B2 | 4/2008 | Banba et al. | |
| 7,416,822 B2 * | 8/2008 | Kanada et al. ................. 430/18 |
| 8,198,002 B2 * | 6/2012 | Jung et al. ..................... 430/191 |
| 2004/0253537 A1 | 12/2004 | Rushkin et al. | |
| 2006/0216441 A1 | 9/2006 | Schubel et al. | |
| 2007/0154843 A1 | 7/2007 | Kanada et al. | |
| 2009/0214860 A1 | 8/2009 | Enoki et al. | |
| 2010/0099043 A1 * | 4/2010 | Jung et al. ................. 430/283.1 |
| 2011/0009506 A1 | 1/2011 | Lee et al. | |
| 2012/0156616 A1 | 6/2012 | Cho et al. | |

FOREIGN PATENT DOCUMENTS

| | | |
|---|---|---|
| EP | 0557991 A1 | 9/1993 |
| EP | 1491952 A2 | 12/2004 |
| JP | 63-096162 A | 4/1988 |
| JP | 09-302221 A | 11/1997 |
| JP | 10-307393 | 11/1998 |
| JP | 2000-292913 A | 10/2000 |
| JP | 2006-091772 A | 4/2006 |
| JP | 2006-349700 | 12/2006 |
| JP | 2007-017726 A | 1/2007 |
| JP | 2007-079264 | 3/2007 |
| JP | 2008-535003 | 8/2008 |
| KR | 10-0264691 B | 9/2000 |
| KR | 10-2001-011635 A | 2/2001 |
| KR | 10-2006-0004908 A | 1/2006 |
| KR | 10-2008-040569 A | 5/2008 |
| KR | 10-2008-0053382 A | 6/2008 |
| KR | 10-2009-0097679 A | 9/2009 |
| WO | 2006/104803 A2 | 10/2006 |

OTHER PUBLICATIONS

Office Action in commonly owned U.S. Appl. No. 13/241,612 mailed Oct. 3, 2012, pp. 1-9.
Taiwanese Search Report in counterpart Taiwanese Application No. 098143652 dated Jan. 2, 2013, pp. 1.

\* cited by examiner

*Primary Examiner* — John Chu
(74) *Attorney, Agent, or Firm* — Summa, Additon & Ashe, P.A.

(57) ABSTRACT

Disclosed is a positive photosensitive resin composition that includes: (A) a polybenzoxazole precursor including a repeating unit represented by the Chemical Formula 1, a repeating unit represented by the Chemical Formula 2, or a combination thereof, and a thermally polymerizable functional group at least one terminal end of the polybenzoxazole precursor; (B) a photosensitive diazoquinone compound; (C) a silane compound; (D) a phenol compound including a cross-linking functional group; and (E) a solvent.

13 Claims, No Drawings

POSITIVE PHOTOSENSITIVE RESIN COMPOSITION

CROSS-REFERENCE TO RELATED APPLICATION

This application claims priority to and the benefit of Korean Patent Application No. 10-2009-0108273 filed in the Korean Intellectual Property Office on Nov. 10, 2009, the entire disclosure of which is incorporated herein by reference.

FIELD OF THE INVENTION

The present invention relates to a positive photosensitive resin composition.

BACKGROUND OF THE INVENTION

Conventional surface protective layers and interlayer insulating layers for semiconductor devices typically include a polyimide resin which can have excellent heat resistance, electrical characteristics, mechanical characteristics, and the like. Recently, photosensitive polyimide precursor compositions which can be coated easily have been used as the polyimide resin. The photosensitive polyimide precursor composition is coated on a semiconductor device, patterned by ultraviolet (UV) rays, developed, and heat imidized, to easily provide a surface protective layer, an interlayer insulating layer, and the like. Accordingly, it is possible to significantly shorten the processing time compared with that of a conventional non-photosensitive polyimide precursor composition.

A photosensitive polyimide precursor composition can be a positive type in which an exposed part is dissolved by development or a negative type in which the exposed part is cured and maintained. It can be advantageous to use a positive type since it can be developed by a non-toxic alkali aqueous solution. A positive photosensitive polyimide precursor composition can include a polyimide precursor of polyamic acid, a photosensitive material of diazonaphtoquinone, and the like. However, the positive photosensitive polyimide precursor composition has a problem in that a desired pattern may not be obtained because the carboxylic acid of the polyamic acid is too highly soluble in an alkali.

Japanese Patent Laid-Open Publication No. H10-307393A is directed to a material including a phenolic hydroxyl group instead of carboxylic acid which is introduced by esterificating polyamidic acid with an alcohol compound having at least one hydroxyl group). This material, however, may be insufficiently developed, which can cause problems such as layer loss or resin delamination from the substrate.

Recently, a material in which a polybenzoxazole precursor is mixed with a diazonaphtoquinone compound has drawn attention (Japanese Patent Laid-open Publication No. S63-96162). When the polybenzoxazole precursor composition is actually used, however, layer loss of an unexposed part can be significantly increased, so it can be difficult to obtain a desirable pattern after the developing process. In order to improve this, if the molecular weight of the polybenzoxazole precursor is increased, the amount of layer loss of the unexposed part may be reduced. Development residue (scum) of the exposed part, however, can be generated, which can decrease resolution and increase development time on the exposed part.

It has been reported that the layer loss of the unexposed part can be suppressed by adding a certain phenol compound to a polybenzoxazole precursor composition (Japanese Patent Laid-Open Publication No. H9-302221 and Japanese Patent Laid-Open Publication No. 2000-292913). However, the effect of suppressing the layer loss of the unexposed part may be insufficient. Accordingly there is still a need to improve layer loss suppression and prevent development residue (scum) generation.

Furthermore, when this polyimide or polybenzoxazole precursor composition is prepared into a thermally cured film, the thermally cured film should have excellent mechanical properties such as tensile strength, and elongation, when it remains in a semiconductor device and acts as a surface protective layer. However, generally-used polyimide or polybenzoxazole precursors tend to have inappropriate mechanical properties, in particular, poor elongation, and also poor heat resistance.

In order to solve this problem, it has been reported that various additives can be added thereto or a precursor compound that is cross-linkable during the thermal curing can be used. However, although such additives or precursor compounds may improve mechanical properties, such as elongation, they may not provide desired optical characteristics such as sensitivity, resolution, and the like. Accordingly, there is still a need for materials and methods that can provide excellent mechanical properties without substantially deteriorating optical characteristics.

SUMMARY OF THE INVENTION

One aspect of the present invention provides a positive photosensitive resin composition that can have excellent sensitivity, resolution, pattern formation properties, residue removal properties, mechanical properties, and/or reliability.

Another aspect of the present invention provides a photosensitive resin film fabricated by using the positive photosensitive resin composition.

A further aspect of this disclosure provides a semiconductor device including the photosensitive resin film.

According to an aspect of this disclosure, a positive photosensitive resin composition is provided that includes (A) a polybenzoxazole precursor including a repeating unit represented by the following Chemical Formula 1, a repeating unit represented by the following Chemical Formula 2, or a combination thereof, and a thermally polymerizable functional group at least one terminal end of the polybenzoxazole precursor, (B) a photosensitive diazoquinone compound, (C) a silane compound, (D) a phenol compound including a cross-linking functional group, and (E) a solvent.

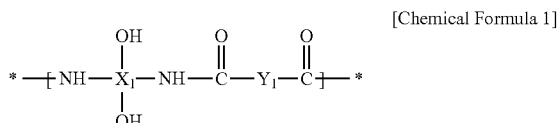
[Chemical Formula 1]

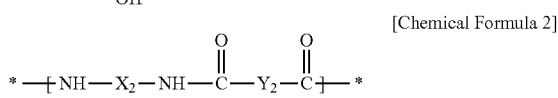
[Chemical Formula 2]

In the above Chemical Formulae 1 and 2, $X_1$ is an aromatic organic group, $X_2$ is an aromatic organic group, a divalent to hexavalent alicyclic organic group, or a functional group represented by the following Chemical Formula 3, and $Y_1$ and $Y_2$ are each independently an aromatic organic group or a divalent to hexavalent alicyclic organic group.

[Chemical Formula 3]

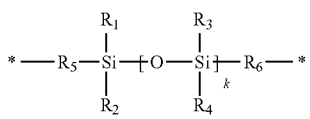

In the above Chemical Formula 3, $R_1$ to $R_4$ are the same or different and are independently substituted or unsubstituted alkyl, substituted or unsubstituted aryl, substituted or unsubstituted alkoxy, or hydroxyl, $R_5$ and $R_6$ are the same or different and are independently substituted or unsubstituted alkylene or substituted or unsubstituted arylene, and k is an integer ranging from 1 to 50.

In the polybenzoxazole precursor, the thermally polymerizable functional group may be derived from reactive end-capping monomers. Exemplary reactive end-capping monomer include without limitation monoamines, monoanhydrides, and monocarboxylic acid halides, and the like, and combinations thereof.

Examples of the monoamines include without limitation toluidine, dimethylaniline, ethylaniline, aminophenol, aminobenzylalcohol, aminoindan, aminoacetophenone, and the like, and combinations thereof.

Examples of the monoanhydrides include without limitation 5-norbornene-2,3-dicarboxylic anhydride represented by the following Chemical Formula 13, 3,6-epoxy-1,2,3,6-tetrahydrophthalic anhydride represented by the following Chemical Formula 14, isobutenyl succinic anhydride represented by the following Chemical Formula 15, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

[Chemical Formula 13]

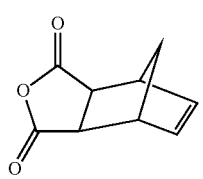

[Chemical Formula 14]

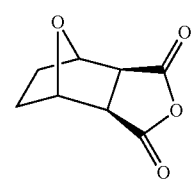

[Chemical Formula 15]

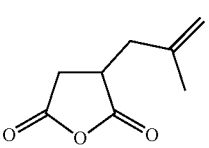

Examples of the monocarboxylic acid halides are represented by the following Chemical Formula 21, and combinations thereof.

[Chemical Formula 21]

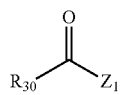

In the above Chemical Formula 21, $R_{30}$ is a substituted or unsubstituted alicyclic organic group or a substituted or unsubstituted aromatic organic group, and $Z_1$ is F, Cl, Br, or I.

Examples of the monocarboxylic acid halides include without limitation 5-norbornene-2-carboxylic acid halide represented by the following Chemical Formula 22, 4-nadimido benzoyl halide represented by the following Chemical Formula 23, 4-(4-phenylethynylphthalimido)benzoyl halide represented by the following Chemical Formula 24, 4-(2-phenylmaleicimido)benzoyl halide represented by the following Chemical Formula 25, benzoyl halide represented by the following Chemical Formula 26, cyclohexane carbonyl halide represented by the following Chemical Formula 27, 4-(3-phenylethynylphthalimido)benzoyl halide, 4-maleimido benzoylhalide, and the like, and combinations thereof.

[Chemical Formula 22]

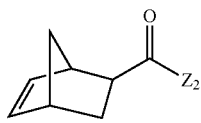

[Chemical Formula 23]

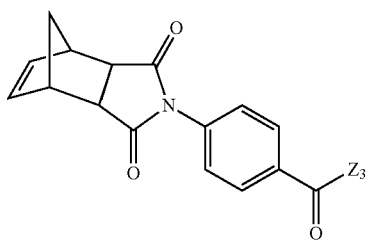

[Chemical Formula 24]

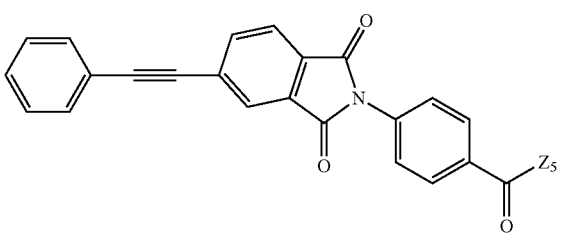

[Chemical Formula 25]

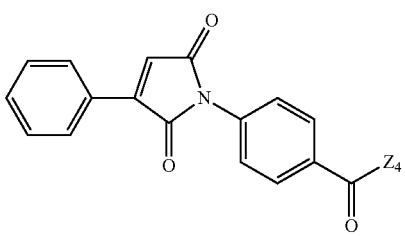

[Chemical Formula 26]

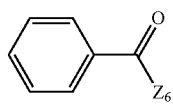

[Chemical Formula 27]

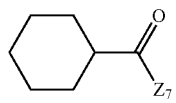

In the above Chemical Formulae 22 to 27, $Z_2$ to $Z_7$ are the same or different and are independently F, Cl, Br, or I.

When the polybenzoxazole precursor includes a combination of a repeating unit represented by Chemical Formula 1 and a repeating unit represented by Chemical Formula 2, and the total amount of a repeating unit represented by Chemical Formula 1 and a repeating unit represented by the above Chemical Formula 2 is about 100 mol %, the repeating unit represented by Chemical Formula 1 may be included in an amount ranging from about 60 mol % to about 95 mol %, and the repeating unit represented by Chemical Formula 2 may be included in an amount ranging from about 5 mol % to about 40 mol %.

The polybenzoxazole precursor may have a weight average molecular weight (Mw) ranging from about 3000 to about 300,000.

The phenol compound including a cross-linking functional group may be represented by the following Chemical Formula 36 and combinations thereof.

[Chemical Formula 36]

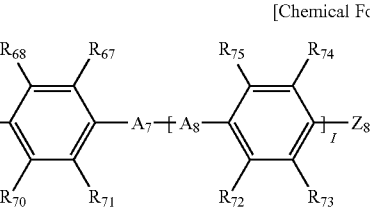

In the above Chemical Formula 36, $R_{67}$ to $R_{75}$ are the same or different and are independently hydrogen, hydroxyl, alkyl, substituted or unsubstituted aryl, substituted or unsubstituted alkoxy, or halogen, wherein at least one of $R_{67}$ to $R_{75}$ is hydroxyl, $A_7$ and $A_8$ are the same or different and are independently O, CO, $CR_{211}R_{212}$, $SO_2$, S, or a single bond, $R_{211}$ and $R_{212}$ are the same or different and are independently hydrogen or substituted or unsubstituted alkyl, $Z_8$ is a substituted or unsubstituted aromatic organic group including an unsaturated bond, a substituted or unsubstituted aliphatic organic group including an unsaturated bond, or a substituted or unsubstituted alicyclic organic group including an unsaturated bond, and I is an integer ranging from 0 to 3.

In one embodiment, $Z_8$ may be selected from the group represented by the following Chemical Formulae 37 to 40, and combinations thereof.

[Chemical Formula 37]

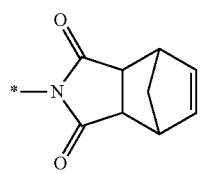

[Chemical Formula 38]

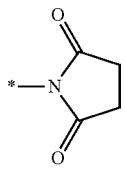

[Chemical Formula 39]

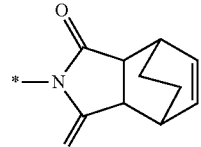

[Chemical Formula 40]

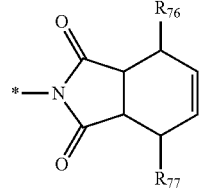

In the above Chemical Formula 40, $R_{76}$ and $R_{77}$ are the same or different and are independently H or $CH_3$.

In one embodiment, the phenol compound including a cross-linking functional group may be represented by the following Chemical Formulae 41 to 48, and combinations thereof.

[Chemical Formula 41]

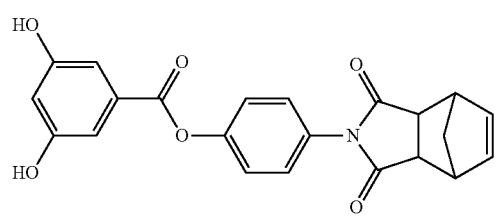

[Chemical Formula 42]

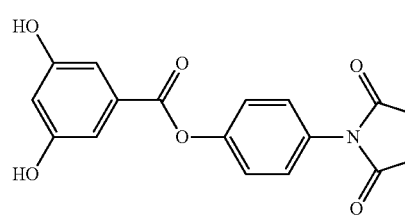

[Chemical Formula 43]

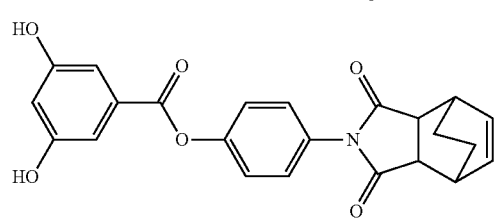

[Chemical Formula 44]

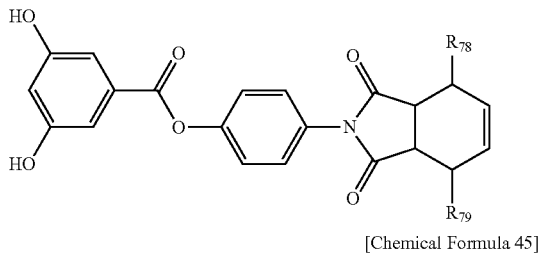

[Chemical Formula 45]

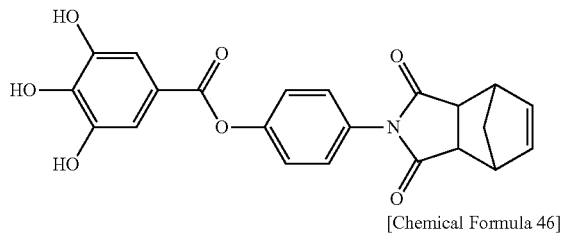

[Chemical Formula 46]

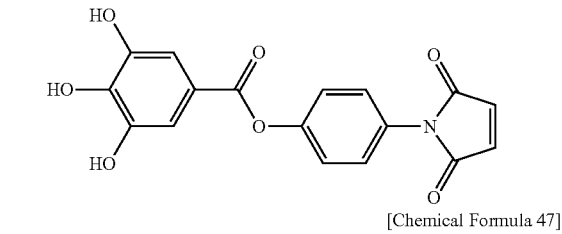

[Chemical Formula 47]

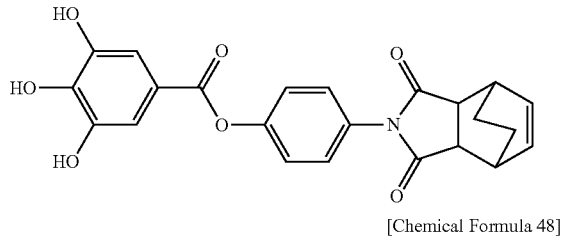

[Chemical Formula 48]

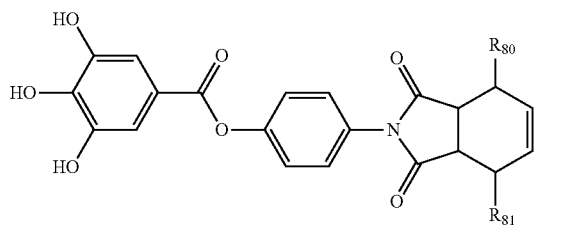

In the above Chemical Formulae 44 and 48,
$R_{75}$ to $R_{81}$ are the same or different and are independently H or $CH_3$.

The positive photosensitive resin composition may include about 5 parts to about 100 parts by weight of the photosensitive diazoquinone compound (B), about 1 parts to about 30 parts by weight of the phenol compound including the cross-linking functional group (C), about 0.1 parts to about 30 parts by weight of the silane compound (D), and about 50 parts to about 300 parts by weight of the solvent (E), wherein the parts by weight of each of (B), (C), (D) and (E) is based on about 100 parts by weight of the polybenzoxazole precursor (A).

According to another aspect of this disclosure, a photosensitive resin film made using the positive photosensitive resin composition is provided.

According to a further aspect of this disclosure, a semiconductor device including the photosensitive resin film is provided.

Hereinafter, further aspects of this disclosure will be described in detail.

The positive photosensitive resin composition of this disclosure may improve development using an alkali development solution, and may improve mechanical properties and reliability of a film since a phenol compound including a cross-linking functional group can be bonded to a polybenzoxazole precursor. Accordingly, the molecular weight of a polymer before a curing process may be reduced, and high sensitivity, high resolution, excellent pattern formation, excellent residue removal property, high elongation, high tensile strength, and/or low film shrinkage may be realized.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least one or more substituents selected from the group consisting of halogen (F, Br, Cl or I), hydroxyl, nitro, cyano, amino ($NH_2$, $NH(R_{200})$, or $N(R_{201})(R_{202})$, wherein $R_{200}$, $R_{201}$, and $R_{202}$ are the same or different, and are independently C1 to C10 alkyl), amidino, hydrazine, hydrazone, carboxyl, substituted or unsubstituted alkyl, substituted or unsubstituted alicyclic organic group, substituted or unsubstituted aryl, substituted or unsubstituted alkenyl, substituted or unsubstituted alkynyl, substituted or unsubstituted heteroaryl, substituted or unsubstituted heterocyclic, and combinations thereof.

As used herein, when a specific definition is not otherwise provided, the term "alkyl" refers to a C1 to C30 alkyl, for example C1 to C15 alkyl, the term "cycloalkyl" refers to C3 to C30 cycloalkyl, for example C3 to C18 cycloalkyl, the term "alkoxy" refers to C1 to C30 alkoxy, for example C1 to C18 alkoxy, the term "aryl" refers to C6 to C30 aryl, for example C6 to C18 aryl, the term "alkenyl" refers to C2 to C30 alkenyl, for example C2 to C18 alkenyl, the term "alkynyl" refers to C2 to C30 alkynyl, the term "alkylene" refers to C1 to C30 alkylene, for example C1 to C18 alkylene, the term "alkenylene" refers to C2 to C30 alkenylene, the term "alkynylene" refers to C2 to C30 alkynylene, the term "cycloalkenyl" refers to C3 to C30 cycloalkenyl, the term "cycloalkynyl" refers to C3 to C30 cycloalkynyl, the term "cycloalkylene" refers to C3 to C30 cycloalkylene, the term "cycloalkenylene" refers to C3 to C30 cycloalkenylene, the term "cycloalkynylene" refers to C3 to C30 cycloalkynylene, the term "heteroaryl" refers to C2 to C30 heteroaryl, the term "heteroarylene" refers to C2 to C30 heteroarylene, the term "heterocyclic" refers to C2 to C30 heterocyclic, and the term "arylene" refers to C6 to C30 arylene, for example C6 to C18 arylene. Also as used herein, when a specific definition is not otherwise provided, the term "hetero" refers to a group including 1 to 20, for example 1 to 15, and as another example 1 to 5, heteroatoms comprising one or more of N, O, S, P, Si, and combinations thereof.

As used herein, when specific definition is not otherwise provided, the term "aliphatic organic group" refers to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "aromatic organic group" refers to C6 to C30 aryl, C2 to C30 heteroaryl, C6 to C30 arylene, or C2 to C30 heteroarylene, for example C6 to C16 aryl, C2 to C16 heteroaryl, C6 to C16 arylene, or C2 to C16 heteroarylene.

As used herein, when a specific definition is not otherwise provided, the term "combination" refers to mixing or copolymerization. Also, the term "copolymerization" refers to block copolymerization or random copolymerization, and the term "copolymer" refers to a block copolymer or a random copolymer.

Also, "*" refers to a linking part between the same or different atoms, or chemical formulae.

In one embodiment of the invention, a positive photosensitive resin composition may include (A) a polybenzoxazole precursor including a repeating unit represented by the following Chemical Formula 1, a repeating unit represented by the following Chemical Formula 2, or a combination thereof, and a thermal polymerizable functional group at least one terminal end of the polybenzoxazole precursor, (B) a photosensitive diazoquinone compound, (C) a silane compound, (D) a phenol compound including a cross-linking functional group, and (E) a solvent.

[Chemical Formula 1]

$$*\!+\!NH\!-\!\underset{\underset{OH}{|}}{\overset{\overset{OH}{|}}{X_1}}\!-\!NH\!-\!\overset{O}{\overset{\|}{C}}\!-\!Y_1\!-\!\overset{O}{\overset{\|}{C}}\!+\!*$$

[Chemical Formula 2]

$$*\!+\!NH\!-\!X_2\!-\!NH\!-\!\overset{O}{\overset{\|}{C}}\!-\!Y_2\!-\!\overset{O}{\overset{\|}{C}}\!+\!*$$

In the above Chemical Formulae 1 and 2, $X_1$ is an aromatic organic group, $X_2$ is an aromatic organic group, a divalent to hexavalent alicyclic organic group, or a functional group represented by the following Chemical Formula 3, and $Y_1$ and $Y_2$ are the same or different and are independently an aromatic organic group or a divalent to hexavalent alicyclic organic group.

[Chemical Formula 3]

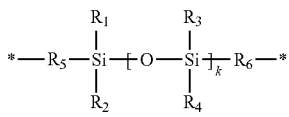

In the above Chemical Formula 3, $R_1$ to $R_4$ are the same or different and are independently substituted or unsubstituted alkyl, substituted or unsubstituted aryl, substituted or unsubstituted alkoxy, or hydroxyl, $R_5$ and $R_6$ are the same or different and are independently substituted or unsubstituted alkylene or substituted or unsubstituted arylene, and k is an integer ranging from 1 to 50.

The positive photosensitive resin composition may further include an additional additive (F).

Hereinafter, each composition component is described in detail.

(A) Polybenzoxazole Precursor

The polybenzoxazole precursor includes a repeating unit represented by the above Chemical Formula 1, a repeating unit represented by the above Chemical Formula 2, or a combination thereof, and a thermal polymerizable functional group at at least one terminal end of the polybenzoxazole precursor.

In the above Chemical Formula 1, $X_1$ may be an aromatic organic group.

$X_1$ may be a residual group derived from an aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X_1$ may include without limitation functional groups represented by the following Chemical Formulae 4 and 5, and combinations thereof.

[Chemical Formula 4]

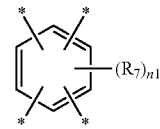

[Chemical Formula 5]

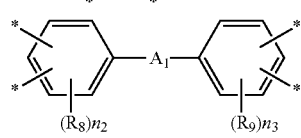

In the above Chemical Formulae 4 and 5, $A_1$ is O, CO, $CR_{203}R_{204}$, $SO_2$, S, or a single bond, wherein $R_{203}$ and $R_{204}$ are the same or different and are independently hydrogen or substituted or unsubstituted alkyl, and in one embodiment, may be a fluoroalkyl group, $R_7$ to $R_9$ are the same or different and are independently hydrogen, substituted or unsubstituted alkyl, hydroxyl, carboxyl, or thiol, $n_1$ is an integer of 1 or 2, and $n_2$ and $n_3$ are the same or different and are independently integers ranging from 1 to 3.

According to the above Chemical Formula 2, $X_2$ is an aromatic organic group, a divalent to hexavalent alicyclic organic group, or a functional group represented by the above Chemical Formula 3.

$X_2$ may be a residual group derived from an aromatic diamine, an alicyclic diamine, or a silicon diamine.

Examples of the aromatic diamine include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, a compound substituted with an alkyl group or a halogen atom on the aromatic ring of the aromatic diamine mentioned above, and the like, and combinations thereof.

Examples of the silicon diamine include without limitation bis(4-aminophenyl)dimethylsilane, bis(4-aminophenyl)tetramethyldisiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

Examples of the alicyclic diamine include without limitation 1,4-diaminocyclohexane, 1,3-diaminocyclohexane, 1,2-diaminocyclohexane, 4,4'-methylenebiscyclohexylamine, 4,4'-methylenebis(2-methylcyclohexylamine), and the like, and combinations thereof.

Examples of $X_2$ include without limitation a functional group represented by the following Chemical Formulae 6 to 9 and combinations thereof.

In the above Chemical Formulae 6 to 9, $A_3$ and $A_4$ are the same or different and are independently O, CO, $CR_{205}R_{206}$, $SO_2$, S, or a single bond, wherein $R_{205}$ and $R_{206}$ are the same or different and are independently hydrogen or substituted or unsubstituted alkyl, and in one embodiment, may be a fluoroalkyl group, $R_{13}$ to $R_{18}$ are the same or different and are independently hydrogen, substituted or unsubstituted alkyl, hydroxyl, carboxyl, or thiol, $n_7$ and $n_{10}$ are the same or different and are independently integers ranging from 1 to 4, and $n_8$, $n_9$, $n_{11}$, and $n_{12}$ are the same or different and are independently integers ranging from 1 to 5.

In the above Chemical Formulae 1 and 2, $Y_1$ and $Y_2$ are the same or different and are independently an aromatic organic group or a divalent to hexavalent alicyclic organic group.

$Y_1$ and $Y_2$ may be a residual group derived from a dicarboxylic acid or a residual group derived from a dicarboxylic acid derivative.

Examples of the dicarboxylic acid include without limitation $Y_1(COOH)_2$ or $Y_2(COOH)_2$ ($Y_1$ and $Y_2$ are the same as $Y_1$ and $Y_2$ of the above Chemical Formulae 1 and 2).

Examples of the carboxylic acid derivative include without limitation a carbonyl halide derivative of $Y_1(COOH)_2$, a carbonyl halide derivative of $Y_2(COOH)_2$, an active compound of an active ester derivative obtained by reacting $Y_1(COOH)_2$ with 1-hydroxy-1,2,3-benzotriazole, or an active compound of an active ester derivative obtained by reacting $Y_2(COOH)_2$ with 1-hydroxy-1,2,3-benzotriazole ($Y_1$ and $Y_2$ are the same as $Y_1$ and $Y_2$ of the above Chemical Formulae 1 and 2). Examples of the dicarboxylic acid derivative include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylate dibenzotriazole, and the like, and combinations thereof.

Examples of $Y_1$ and $Y_2$ may include without limitation a functional group represented by the following Chemical Formulae 10 to 12, and combinations thereof.

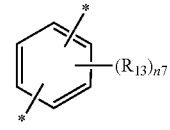

[Chemical Formula 6]

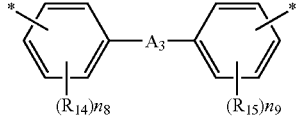

[Chemical Formula 7]

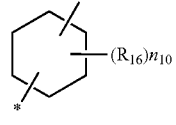

[Chemical Formula 8]

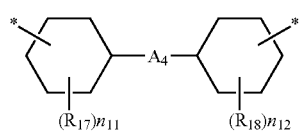

[Chemcal Formula 9]

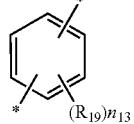

[Chemical Formula 10]

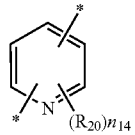

[Chemical Formula 11]

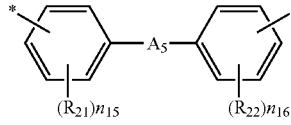

[Chemical Formula 12]

In the above Chemical Formulae 10 to 12, $R_{19}$ to $R_{22}$ are the same or different and are independently hydrogen or substituted or unsubstituted alkyl, $n_{13}$ is an integer ranging from 1 to 4, $n_{14}$, $n_{15}$, and $n_{16}$ are an integer ranging from 1 to 3, and $A_5$ is O, $CR_{207}R_{208}$, CO, CONH, S, $SO_2$, or a single bond, wherein $R_{207}$ and $R_{208}$ are the same or different and are independently hydrogen or substituted or unsubstituted alkyl, and in one embodiment, may be a fluoroalkyl group.

Further, the polybenzoxazole precursor may include a thermal polymerizable functional group at least one terminal end of the polybenzoxazole precursor. The thermal polymerizable functional group may be bonded with the cross-linking functional group included in a phenol compound.

The thermal polymerizable functional group may be derived from an end-capping monomer, for example, monoamines, monoanhydrides, or monocarboxylic acid halides.

Examples of the monoamines include without limitation toluidine, dimethylaniline, ethylaniline, aminophenol, aminobenzylalcohol, aminoindan, aminoacetonephenone, and the like, and combinations thereof.

Examples of the monoanhydrides include without limitation 5-norbornene-2,3-dicarboxylic anhydride represented by the following Chemical Formula 13, 3,6-epoxy-1,2,3,6-tetrahydrophthalic anhydride represented by the following Chemical Formula 14, or isobutenyl succinic anhydride represented by the following Chemical Formula 15, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

[Chemical Formula 13]

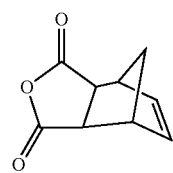

[Chemical Formula 14]

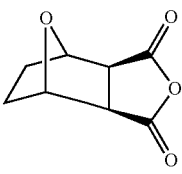

[Chemical Formula 15]

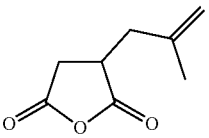

A thermal polymerizable functional group derived from the monoanhydrides can include without limitation a functional group represented by the following Chemical Formulae 16 to 20, and combinations thereof. The thermal polymerizable functional group may be cross-linked during heating of the polybenzoxazole precursor preparation process, and may be formed as a residual group at the terminal end of the polybenzoxazole precursor.

[Chemical Formula 16]

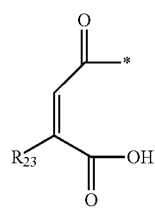

In the above Chemical Formula 16, $R_{23}$ is H, $CH_2COOH$, or $CH_2CHCHCH_3$.

[Chemical Formula 17]

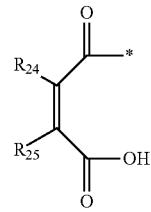

In the above Chemical Formula 17,
$R_{24}$ and $R_{25}$ are the same or different and are independently H or $CH_3$.

[Chemical Formula 18]

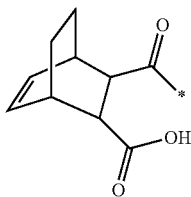

[Chemical Formula 19]

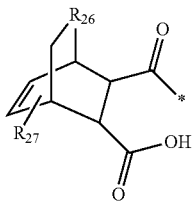

In the above Chemical Formula 19,
$R_{26}$ is $CH_2$ or O, and $R_{27}$ is H or $CH_3$.

[Chemical Formula 20]

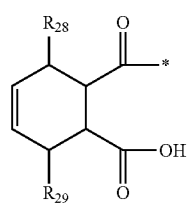

In the above Chemical Formula 20,
$R_{28}$ and $R_{29}$ are the same or different and are independently H, $CH_3$, or $OCOCH_3$.

The monocarboxylic acid halides may be represented by the following Chemical Formula 21.

[Chemical Formula 21]

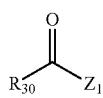

In the above Chemical Formula 21,
$R_{30}$ is a substituted or unsubstituted alicyclic organic group or a substituted or unsubstituted aromatic organic group. The substituted alicyclic organic group or substituted aromatic organic group is substituted with a substituent selected from the group consisting of a substituted or unsubstituted amidino group, a substituted or unsubstituted alicyclic organic group, and a fused ring of a substituted or unsubstituted alicyclic organic group with an aryl group. The alicyclic organic group as the substituent may be a maleimide group.

$Z_1$ is F, Cl, Br, or I.

Examples of the monocarboxylic acid halides include without limitation 5-norbornene-2-carboxylic acid halide represented by the following Chemical Formula 22, 4-nadimido benzoyl halide represented by the following Chemical Formula 23, 4-(4-phenylethynylphthalimido)benzoyl halide represented by the following Chemical Formula 24, 4-(2-phenylmaleicimido)benzoyl halide represented by the following Chemical Formula 25, benzoyl halide represented by the following Chemical Formula 26, cyclohexane carbonyl halide represented by the following Chemical Formula 27, 4-(3-phenylethynylphthalimido)benzoyl halide, 4-maleimidobenzoyl halide, and the like, and combinations thereof. These may be used singularly or in combination.

[Chemical Formula 22]

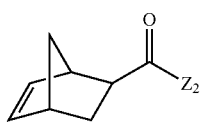

[Chemical Formula 23]

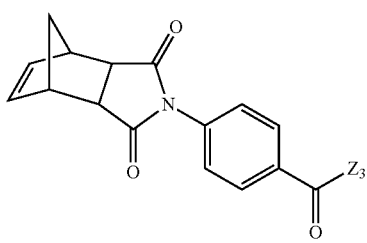

[Chemical Formula 24]

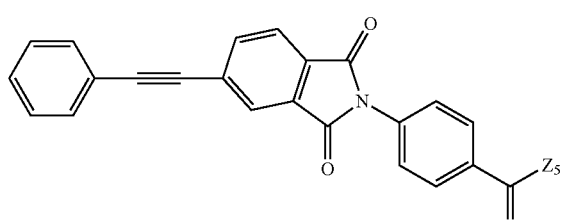

[Chemical Formula 25]

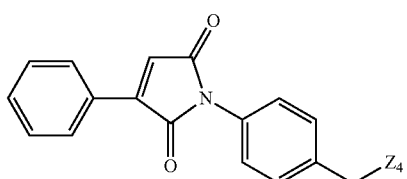

[Chemical Formula 26]

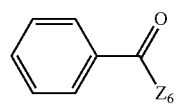

[Chemical Formula 27]

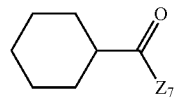

In the above Chemical Formulae 22 to 27, $Z_2$ to $Z_7$ are the same or different and are independently F, Cl, Br, or I.

The polybenzoxazole precursor can have a weight average molecular weight (Mw) ranging from about 3000 to about 300,000. When the polybenzoxazole precursor has a weight average molecular weight within this range, sufficient properties and excellent solubility to the organic solvent may be provided.

When the polybenzoxazole precursor includes a combination of a repeating unit represented by the above Chemical Formula 1 and a repeating unit represented by the above Chemical Formula 2, and the total amount of a repeating unit represented by the above Chemical Formula 1 and a repeating unit represented by the above Chemical Formula 2 is about 100 mol %, a repeating unit represented by above Chemical Formula 1 may be included in an amount ranging from about 60 mol % to about 95 mol % and a repeating unit represented by the above Chemical Formula 2 may be included in an amount ranging from about 5 mol % to about 40 mol %. In some embodiments, a repeating unit represented by the above Chemical Formula 1 may be included in an amount ranging from about 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 mol % and a repeating unit represented by the above Chemical Formula 2 may be included in an amount ranging from about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 mol %. Further, according to some embodiments of the present invention, the amount of a repeating unit represented by the above Chemical Formula 1 and/or the above Chemical Formula 2 can be in a range from about any of the foregoing amounts to about any other of the foregoing amounts.

(B) Photosensitive Diazoquinone Compound

The photosensitive diazoquinone compound may be a compound including a 1,2-benzoquinone diazide or 1,2-naphtoquinone diazide structure. These compounds are described in U.S. Pat. Nos. 2,797,213 and 3,669,658, the entire disclosure of each of which is incorporated by reference.

Examples of the photosensitive diazoquinone compound may include without limitation compounds represented by the following Chemical Formulae 28 and 30 to 32 and combinations thereof.

[Chemical Formula 28]

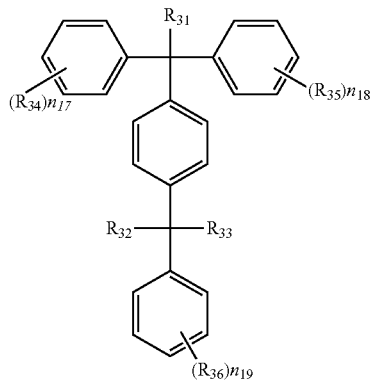

In the above Chemical Formula 28, $R_{31}$ to $R_{33}$ are the same or different and are independently hydrogen or substituted or unsubstituted alkyl, for example $CH_3$, $R_{34}$ to $R_{36}$ are the same or different and are independently OQ, wherein Q is hydrogen, the following Chemical Formula 29a, or Chemical Formula 29b, provided that the Qs are not all simultaneously hydrogen, and $n_{17}$ to $n_{19}$ are the same or different and are independently integers ranging from 1 to 3.

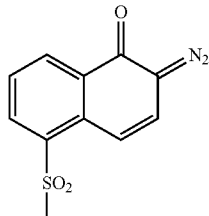

[Chemical Formula 29a]

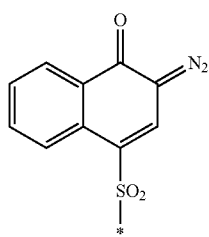

[Chemical Formula 29b]

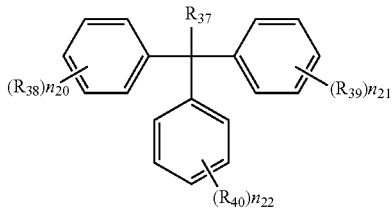

[Chemical Formula 30]

In the above Chemical Formula 30, $R_{37}$ is hydrogen or substituted or unsubstituted alkyl, $R_{38}$ to $R_{40}$ are OQ, wherein Q is the same as defined in the above Chemical Formula 28, and $n_{20}$ to $n_{22}$ are the same or different and are independently integers ranging from 1 to 3.

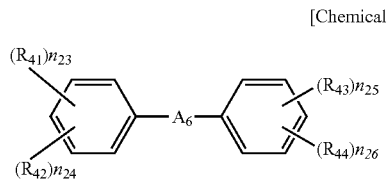

[Chemical Formula 31]

In the above Chemical Formula 31, $A_6$ is CO or $CR_{209}R_{210}$, wherein $R_{209}$ and $R_{210}$ are the same or different and are independently substituted or unsubstituted alkyl, $R_{41}$ to $R_{44}$ are the same or different and are independently hydrogen, substituted or unsubstituted alkyl, OQ, or NHQ, wherein Q is the same as defined in the above Chemical Formula 28, $n_{23}$ to $n_{26}$ are the same or different and are independently integers ranging from 1 to 4, and $n_{23}+n_{24}$ and $n_{25}+n_{26}$ are independently integers of 5 or less, provided that at least one of $R_{41}$ and $R_{42}$ is OQ, and one aromatic ring includes one to three OQs and the other aromatic ring includes one to four OQs.

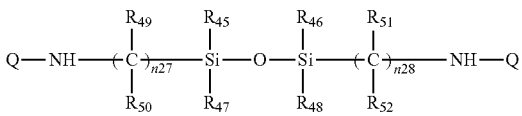

[Chemical Formula 32]

In the above Chemical Formula 32, $R_{45}$ to $R_{52}$ are the same or different and are independently hydrogen or substituted or unsubstituted alkyl, $n_{27}$ and $n_{28}$ are the same or different and are independently integers ranging from 1 to 5, and Q is the same as defined in the above Chemical Formula 28.

The photosensitive diazoquinone compound may be included in the positive photosensitive resin composition in an amount of about 5 to about 100 parts by weight based on about 100 parts by weight of the polybenzoxazole precursor. In some embodiments, the photosensitive diazoquinone compound resin may be included in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight based on about 100 parts by weight of the polybenzoxazole precursor. Further, according to some embodiments of the present invention, the amount of the photosensitive diazoquinone compound can be in a range from about any of the foregoing amounts to about any other of the foregoing amounts. When the amount of the photosensitive diazoquinone compound is within these ranges, the pattern can be well-formed without a residue from exposure, and loss of film thickness during development can be prevented to thereby provide a good pattern.

(C) Silane Compound

The silane compound can improve adherence (adhesion)_ between the photosensitive resin composition and a substrate.

Examples of the silane compound may include without limitation a compound represented by the following Chemical Formulae 33 to 35, and combinations thereof, and a silane compound including a carbon-carbon unsaturated bond such as but not limited to vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, trimethoxy[3-(phenylamino)propyl]silane, and the like, and combinations thereof, but is not limited thereto.

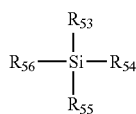

[Chemical Formula 33]

In the above Chemical Formula 33, $R_{53}$ is a vinyl group, substituted or unsubstituted alkyl, or substituted or unsubstituted aryl, and in one embodiment, may be 3-(meth)acryloxypropyl, p-styryl, or 3-(phenylamino)propyl, $R_{54}$ to $R_{56}$ are the same or different and are independently substituted or unsubstituted alkoxy, substituted or unsubstituted alkyl, or halogen, provided that at least one of $R_{53}$ to $R_{56}$ is alkoxy or halogen. The alkoxy may be C1 to C8 alkoxy, and the alkyl may be C1 to C20 alkyl.

[Chemical Formula 34]

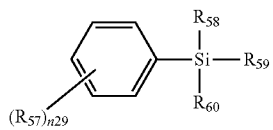

In the above Chemical Formula 34,
$R_{57}$ is $NH_2$ or $CH_3CONH$,
$R_{58}$ to $R_{60}$ are the same or different and are independently substituted or unsubstituted alkoxy, for example $OCH_3$ or $OCH_2CH_3$, and
$n_{29}$ is an integer ranging from 1 to 5.

[Chemical Formula 35]

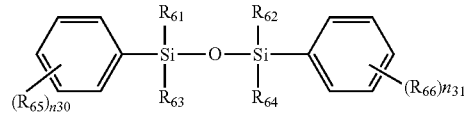

In the above Chemical Formula 35,
$R_{61}$ to $R_{64}$ are the same or different and are independently substituted or unsubstituted alkyl or substituted or unsubstituted alkoxy, for example $CH_3$ or $OCH_3$,
$R_{65}$ and $R_{66}$ are the same or different and are independently substituted or unsubstituted amino, for example $NH_2$ or $CH_3CONH$, and
$n_{30}$ and $n_{31}$ are the same or different and are independently an integer ranging from 1 to 5.

The silane compound may be included in an amount of about 0.1 to about 30 parts by weight based on about 100 parts by weight of the polybenzoxazole precursor. In some embodiments, the silane compound may be included in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight based on about 100 parts by weight of the polybenzoxazole precursor. Further, according to some embodiments of the present invention, the amount of the silane compound can be in a range from about any of the foregoing amounts to about any other of the foregoing amounts. When the silane compound is included in an amount within these ranges, adherence (adhesion) between lower and upper layers can be improved, residue film may not remain after development, and optical characteristics (transmittance) and mechanical properties such as tensile strength and elongation may be improved.

(D) Phenol Compound

The phenol compound is a phenol compound including a cross-linking functional group. The phenol compound including a cross-linking functional group can increase dissolution and sensitivity of exposed parts during development using an alkali aqueous solution, and can play a role of forming high resolution patterns without development residues (scum).

The cross-linking functional group included in the phenol compound may reduce molecular weight of a polymer by cross-linking with a polybenzoxazole precursor, and it may in this manner maintain a solid amount and a viscosity of a photosensitive resin composition at a desirable level. Therefore, a photosensitive resin composition having low film shrinkage, high resolution, excellent pattern formation, excellent residue removal property, high elongation, and high tensile strength may be provided.

The cross-linking functional group may be an unsaturated bond, for example may be a carbon-carbon unsaturated bond, and as another example a carbon-carbon reactivity double bond.

Examples of the phenol compound including the cross-linking functional group include without limitation compounds represented by the following Chemical Formula 36 and combinations thereof.

[Chemical Formula 36]

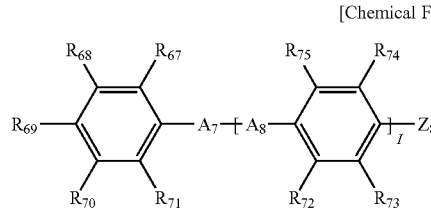

In the above Chemical Formula 36,
$R_{67}$ to $R_{75}$ are the same or different and are independently hydrogen, hydroxyl; alkyl, substituted or unsubstituted aryl, substituted or unsubstituted alkoxy, or halogen, provided that at least one of $R_{67}$ to $R_{75}$ is hydroxyl,
$A_7$ and $A_8$ are the same or different and are independently O, CO, $CR_{211}R_{212}$, $SO_2$, S or a single bond, wherein $R_{211}$ and $R_{212}$ are the same or different and are independently hydrogen or substituted or unsubstituted alkyl, for example a fluoroalkyl group,
$Z_8$ is a substituted or unsubstituted aromatic organic group including an unsaturated bond, a substituted or unsubstituted aliphatic organic group including an unsaturated bond, or a substituted or unsubstituted alicyclic organic group including an unsaturated bond, and
I is an integer ranging from 0 to 3.

Examples of $Z_8$ include without limitation functional groups represented by the following Chemical Formulae 37 to 40, and combinations thereof.

[Chemical Formula 37]

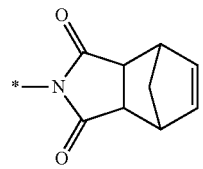

[Chemical Formula 38]

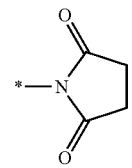

[Chemical Formula 39]

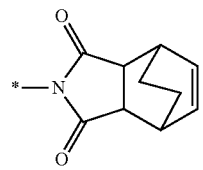

[Chemical Formula 40]

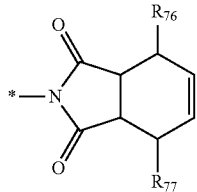

In the above Chemical Formula 40, $R_{76}$ and $R_{77}$ are the same or different and are independently H or $CH_3$.

Examples of the phenol compound including a cross-linking functional group include without limitation compounds represented by the following Chemical Formulae 41 to 48, and combinations thereof.

[Chemical Formula 41]

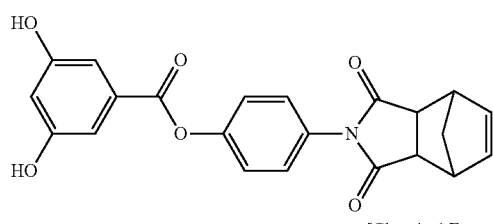

[Chemical Formula 42]

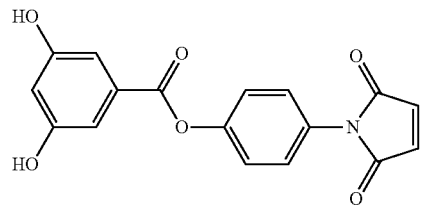

[Chemical Formula 43]

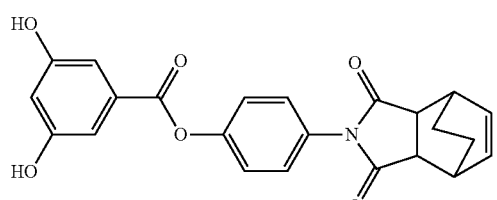

[Chemical Formula 44]

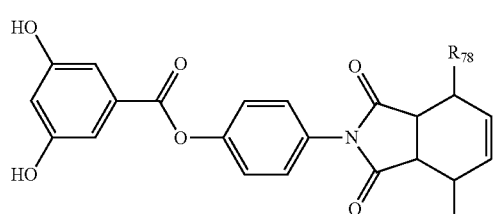

[Chemical Formula 45]

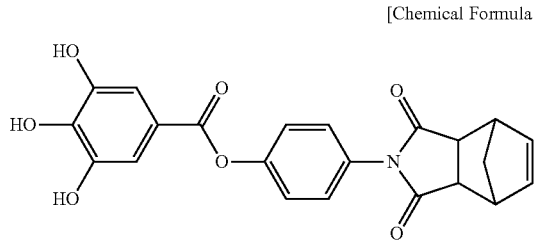

[Chemical Formula 46]

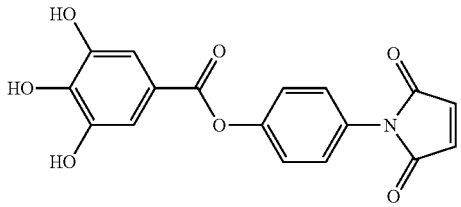

[Chemical Formula 47]

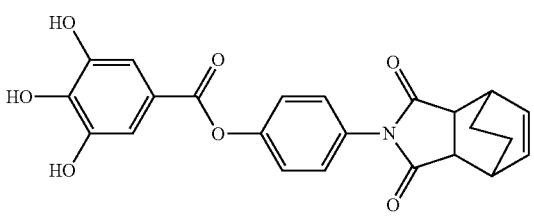

[Chemical Formula 48]

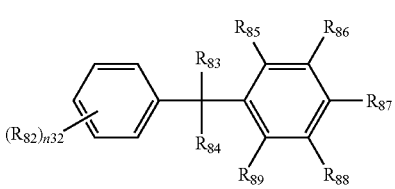

In the above Chemical Formulae 44 and 48, $R_{78}$ to $R_{81}$ are the same or different and are independently H or $CH_3$.

The phenol compound including a cross-linking functional group may be included in an amount of about 1 to about 30 parts by weight based on about 100 parts by weight of the polybenzoxazole precursor. In some embodiments, the phenol compound including a cross-linking functional group may be included in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight based on about 100 parts by weight of the polybenzoxazole precursor. Further, according to some embodiments of the present invention, the amount of the phenol compound including a cross-linking functional group can be in a range from about any of the foregoing amounts to about any other of the foregoing amounts. When the phenol compound including a cross-linking functional group is included in an amount within these ranges, sensitivity during development may be improved, and the dissolubility of the non-exposed part may be suitably increased to provide a good pattern. In addition, precipitation during freezing may be substantially eliminated to provide excellent storage stability.

In the positive photosensitive resin composition, the phenol compound may further include a generally-used phenol compound. Examples of the phenol compound include without limitation compounds represented by the following Chemical Formulae 49 to 54, and combinations thereof.

[Chemical Formula 49]

In the above Chemical Formula 49, $R_{82}$ to $R_{84}$ are the same or different and are independently hydrogen or substituted or unsubstituted alkyl, $R_{85}$ to $R_{89}$ are the same or different and are independently H, OH, or substituted or unsubstituted alkyl, for example $CH_3$, and $n_{32}$ is an integer ranging from 1 to 5.

[Chemical Formula 50]

In the above Chemical Formula 50, $R_{90}$ to $R_{95}$ are the same or different and are independently H, OH, or substituted or unsubstituted alkyl, $A_9$ is $CR_{213}R_{214}$ or a single bond, wherein $R_{213}$ and $R_{214}$ are the same or different and are independently hydrogen, or substituted or unsubstituted alkyl, for example $CH_3$, and $n_{33}+n_{34}+n_{35}$ and $n_{36}+n_{37}+n_{38}$ are the same or different, and are independently integers of 5 or less.

[Chemical Formula 51]

In the above Chemical Formula 51, $R_{96}$ to $R_{98}$ are the same or different and are independently hydrogen, or substituted or unsubstituted alkyl, $n_{39}$, $n_{40}$, and $n_{43}$ are the same or different and are independently integers ranging from 1 to 5, and $n_{41}$ and $n_{42}$ are the same or different and are independently integers ranging from 0 to 4.

[Chemical Formula 52]

In the above Chemical Formula 52, $R_{99}$ to $R_{104}$ are the same or different and are independently hydrogen, OH, or substituted or unsubstituted alkyl, $n_{44}$ to $n_{47}$ are the same or different and are independently integers ranging from 1 to 4, and $n_{44}+n_{46}$ and $n_{45}+n_{47}$ are independently integers of 5 or less.

[Chemical Formula 53]

In the above Chemical Formula 53, $R_{105}$ is substituted or unsubstituted alkyl, for example $CH_3$, $R_{106}$ to $R_{108}$ are the same or different and are independently hydrogen, or substituted or unsubstituted alkyl, $n_{48}$, $n_{50}$, and $n_{52}$ are the same or different and are independently integers ranging from 1 to 5, $n_{49}$, $n_{51}$, and $n_{53}$ are the same or different and are independently integers ranging from 0 to 4, and $n_{48}+n_{49}$, $n_{50}+n_{51}$, and $n_{52}+n_{53}$ are independently integers of 5 or less.

[Chemical Formula 54]

In the above Chemical Formula 54, $R_{109}$ to $R_{111}$ are the same or different and are independently substituted or unsubstituted alkyl, for example $CH_3$, $R_{112}$ to $R_{115}$ are the same or different and are independently hydrogen, or substituted or unsubstituted alkyl, $n_{54}$, $n_{56}$, and $n_{58}$ are the same or different and are independently integers ranging from 1 to 5, $n_{55}$, $n_{57}$, and $n_{59}$ are the same or different and are independently integers ranging from 0 to 4, $n_{60}$ is an integer ranging from 1 to 4, and $n_{54}+n_{55}$, $n_{56}+n_{57}$, and $n_{58}+n_{59}$ are independently integers of 5 or less.

(E) Solvent

The solvent may be an organic solvent, and examples of the organic solvent include without limitation N-methyl-2-pyrrolidone, gamma-butyrolactone, N,N-dimethyl acetate, dimethyl sulfoxide, diethyleneglycol dimethylether, diethyleneglycol diethylether, diethyleneglycol dibutylether, propyleneglycol monomethylether, dipropyleneglycol monomethylether, propyleneglycol monomethylether acetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, and the like, and combinations thereof. The solvent may be used singularly or in combination.

The solvent may be used in an amount of about 50 to about 300 parts by weight based on about 100 parts by weight of the polybenzoxazole precursor. When the solvent is used in an amount within these ranges, a sufficiently thick film can be obtained, and good solubility and coating can be provided.

(F) Other Additives

A positive photosensitive resin composition according to one embodiment may further include (F) one or more other additives.

The other additives can include a latent thermal acid generator. The latent thermal acid generator can include an arylsulfonic acid such as but not limited to p-toluenesulfonic acid and a benzenesulfonic acid; a perfluoroalkylsulfonic acid such as but not limited to trifluoromethanesulfonic acid and trifluorobutanesulfonic acid; an alkylsulfonic acid such as but not limited to methanesulfonic acid, ethanesulfonic acid, and butanesulfonic acid; and the like, and combinations thereof.

The latent thermal acid generator is a catalyst for dehydration reaction of the phenolic hydroxyl group-contained polyamide of the polybenzoxazole precursor and cyclization reaction, and thus a cyclization reaction can be performed smoothly even if curing temperature is decreased.

In addition, the composition of the invention may further include one or more additives such as a suitable surfactant or leveling agent to prevent staining of the film or to improve development.

The process for forming a pattern using a positive photosensitive resin composition includes: coating a positive photosensitive resin composition on a supporting substrate; drying the coated positive photosensitive resin composition to provide a positive photosensitive resin composition layer; exposing the positive photosensitive resin composition layer; developing the exposed positive photosensitive resin composition layer in an alkali aqueous solution to provide a photosensitive resin film; and heating the photosensitive resin film. Processing conditions to provide a pattern are widely known in this art, and the skilled artisan will understand the same without undue experimentation. Accordingly, detailed descriptions thereof will be omitted in this specification.

According to another embodiment, a photosensitive resin film fabricated using the positive photosensitive resin composition is provided. The photosensitive resin film may be used as an insulation layer or a protective layer.

According to further another embodiment, a semiconductor device including the photosensitive resin film is provided.

The photosensitive resin composition according to one embodiment can be used to form an insulation layer, a passivation layer, or a buffer coating layer in a semiconductor device. The positive photosensitive resin composition may be used to form a surface protective layer and an interlayer insulating layer of a semiconductor device.

The following examples illustrate this disclosure in more detail. However, it is understood that this disclosure is not limited by these examples.

Synthesis Example 1

Synthesizing Phenol Compound (P-1)

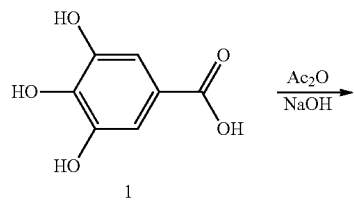

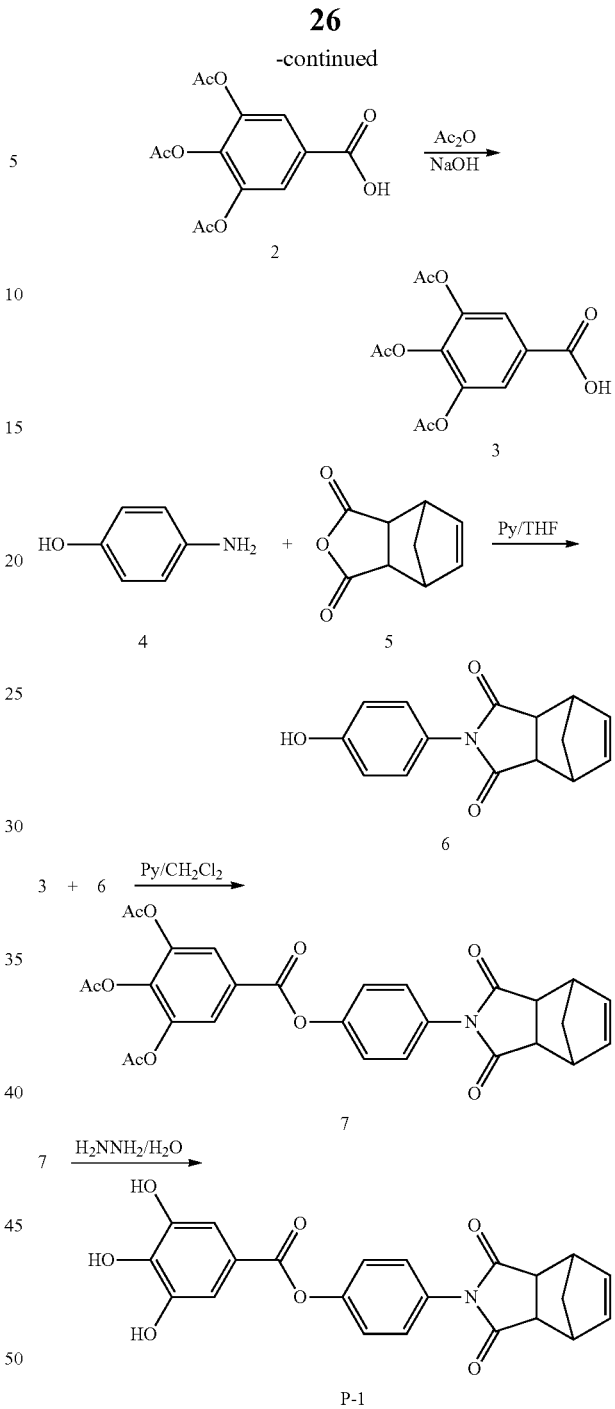

50 g of 3,4,5-trihydroxy benzoic acid (1), 150 g of acetic anhydride, and 34.8 g of sodium hydroxide (NaOH) are reacted in a four-necked flask mounted with an agitator, a temperature controlling device, a nitrogen gas injector, and a condenser, while nitrogen is passed therethrough to synthesize 3,4,5-triacetoxy benzoic acid (2). Acetic anhydride is removed under vacuum conditions, and then 60 g of thionyl chloride ($SOCl_2$) and 5 g of dimethyl formamide (DMF) are added while performing extraction using chloroform to synthesize triacetoxybenzoyl chloride (3).

20 g of 4-aminophenol (4) and 33 g of 5-norbornene-2,3-dicarboxyl anhydride are added to 250 ml of a tetrahydrofuran (THF) solvent including 15.8 g of pyridine in a four-necked flask mounted with an agitator, a temperature controlling device, a nitrogen gas injector, and a condenser while nitrogen is flowing, and then agitation is performed at room temperature for 4 days. After the reaction is complete, the solvent is removed under a vacuum condition and rinsing with water is performed 3 times to provide the compound (6).

10 g of the compound (3) and 8.24 g of the compound (6) are added to 50 g of a methylene chloride ($CH_2Cl_2$) solvent including 2.37 g of pyridine in a four-necked flask mounted with an agitator, a temperature controlling device, a nitrogen gas injector, and a condenser while nitrogen is flowing, and then agitation is performed at 0° C. for 2 hours to synthesize the compound (7).

5 g of the compound (7) is dissolved in 200 ml of an acetonitrile solvent, 15 g of hydrazine monohydrate is added therein, and then agitation is performed at room temperature for 15 minutes. Acetic acid is added in the solution and extraction is performed using 200 ml of ethyl acetate, and then the solvent is removed to synthesize a phenol compound (P-1).

Synthesis Example 2

Synthesizing Phenol Compound (P-2)

A phenol compound (P-2) is synthesized according to the same method as in Synthesis Example 1 except that maleic anhydride is used instead of 5-norbornene-2,3-dicarboxylic anhydride.

Synthesis Example 3

Synthesizing Phenol Compound (P-3)

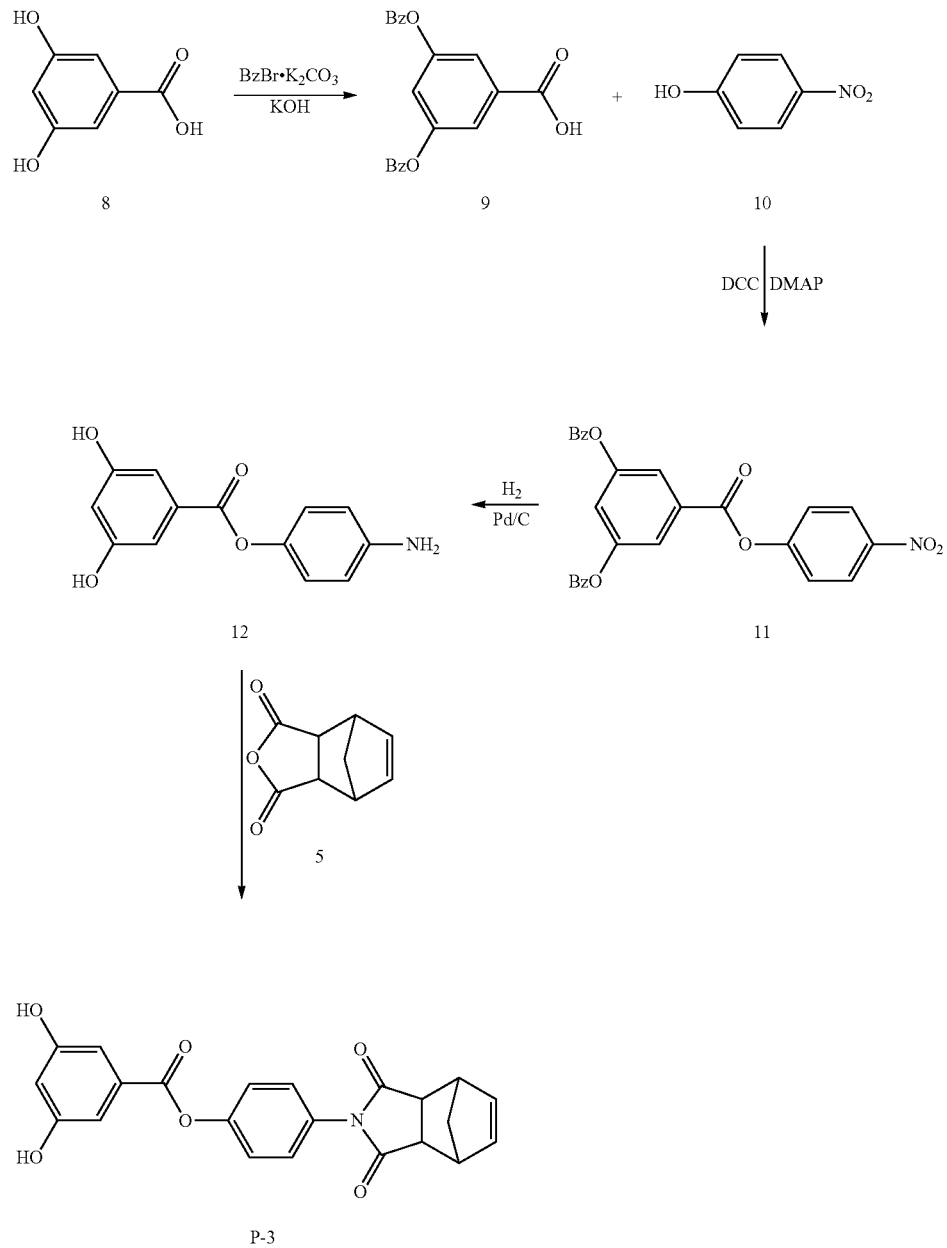

35.5 g of benzyl bromide, 10.0 g of 3,5-dihydroxybenzoic acid (8), and 20.0 g of potassium carbonate ($K_2CO_3$) are added to 250 ml of acetone and refluxed for 24 hours in a four-necked flask mounted with an agitator, a temperature controlling device, a nitrogen gas injector, and a condenser, while nitrogen is passed therethrough. After it is cooled and vacuum-dried, 100 ml of ethanol, 30 ml of distilled water, and 20.0 g of potassium hydroxide are added. Next, it is refluxed for 24 hours, and 400 ml of water is added. Then, glacial acetic acid and dichloromethane are added, and extracted, and a solvent is removed under a vacuum condition to provide the compound (9). 4.60 g of the compound (9) is dissolved in a tetrahydrofuran (THF) solvent, and then 1.55 g of nitrophenol is added therein, and then it is put into dicyclohexyl carbodiimide (DCC) and 4-dimethylaminopyridine (DMAP). Agitation is performed at room temperature for 6 hours, and a solvent is removed under a vacuum condition to provide compound (11). The compound (11) is added to 30 ml of tetrahydrofuran including 200 mg of 10% Pd/C and 300 mg of sodium carbonate, and a hydrogenation reaction is performed. After the reaction is complete, solvent is removed under vacuum conditions and recrystallization with diethylether and dichloromethane is performed to provide the compound (12).

4 g of the compound (12) and 2.7 g of 5-norbornene-2,3-dicarboxylic anhydride (13) are added to 50 ml of a tetrahydrofuran (THF) solvent including 1.3 g of pyridine in a four-necked flask mounted with an agitator, a temperature controlling device, a nitrogen gas injector, and a condenser while nitrogen is flowing, and agitation is performed at room temperature for 4 days. After the reaction is complete, the solvent is removed under a vacuum condition and rinsing with water is performed 3 times to provide the phenol compound (P-3).

Synthesis Example 4

Synthesizing Phenol Compound (P-4)

A phenol compound (P-4) is synthesized according to the same method as in Synthesis Example 3 except that maleic anhydride is used instead of 5-norbornene-2,3-dicarboxylic anhydride.

Synthesis Example 5

Synthesizing Polybenzoxazole Precursor (PBO-1)

17.4 g of 2,2-bis(3-amino-4-hydroxyphenyl)-1,1,1,3,3,3,-hexafluoropropane, 0.86 g of 1,3-bis(aminopropyl)tetramethyl disiloxane, and 280 g of N-methyl-2-pyrrolidone (NMP) are added to and dissolved in a four-necked flask mounted with an agitator, a temperature controlling device, a nitrogen gas injector, and a condenser, while nitrogen is passed therethrough.

When the solid is completely dissolved, 9.9 g of pyridine is added as a catalyst, then a solution prepared by dissolving 13.3 g of 4,4'-oxydibenzoyl chloride in 142 g of N-methyl-2-pyrrolidone (NMP) at a temperature of 0 to 5° C. is dripped slowly therein for 30 minutes. After the dripping, reaction is performed for 1 hour at a temperature of 0 to 5° C., the temperature is increased to room temperature, and then the solution is agitated for 1 hour. 1.6 g of 5-norbornene-2,3-dicarboxylic anhydride is added and agitated at room temperature for 2 hours, and the reaction is terminated. The reaction mixture is put into a solution prepared by mixing water and methanol at a volume ratio of 10:1 to produce a precipitate. The precipitate is filtered and sufficiently rinsed with water, and dried for more than 24 hours under vacuum conditions at a temperature of 80° C. to thereby produce a polybenzoxazole precursor (PBO-1). The weight average molecular weight of the polybenzoxazole precursor (PBO-1) is 9800.

Synthesis Example 6

Synthesizing Polybenzoxazole Precursor (PBO-2)

17.4 g of 2,2-bis(3-amino-4-hydroxyphenyl)-1,1,1,3,3,3-hexafluoropropane and 280 g of N-methyl-2-pyrrolidone (NMP) are added to and dissolved in a four-necked flask mounted with an agitator, a temperature controlling device, a nitrogen gas injector, and a condenser, while nitrogen is passed therethrough.

When the solid is completely dissolved, 9.9 g of pyridine is added as a catalyst, then a solution prepared by dissolving 13.3 g of 4,4'-oxydibenzoyl chloride in 142 g of N-methyl-2-pyrrolidone (NMP) at a temperature of 0 to 5° C. is dripped slowly therein for 30 minutes. After the dripping, reaction is performed for 1 hour at a temperature of 0 to 5° C., the temperature is increased to room temperature, and then the solution is agitated for 1 hour. 1.6 g of 5-norbornene-2,3-dicarboxylic anhydride is added and agitated at room temperature for 2 hours, and the reaction is terminated. The reaction mixture is put into a solution prepared by mixing water and methanol at a volume ratio of 10:1 to produce a precipitate. The precipitate is filtered and sufficiently rinsed with water, and dried for more than 24 hours under vacuum conditions at a temperature of 80° C. to thereby produce a polybenzoxazole precursor (PBO-2). The weight average molecular weight of the polybenzoxazole precursor (PBO-2) is 9650.

Example 1

15 g of the polybenzoxazole precursor (PBO-1) obtained from Synthesis Example 5 is added to and dissolved in 35.0 g of γ-butyrolactone (GBL). Then, 3 g of photosensitive diazoquinone shown in the Chemical Formula 28a, 0.75 g of trimethoxy[3-(phenylamino)propyl]silane shown in the following Chemical Formula 55 as a silane coupling agent, and 1.5 g of the phenol compound obtained in Synthesis Example 1 are added thereto and dissolved therein. Subsequently, the mixture solution is filtered by a 0.45-μm fluorine resin filter to thereby produce a positive photosensitive resin composition.

[Chemical Formula 28a]

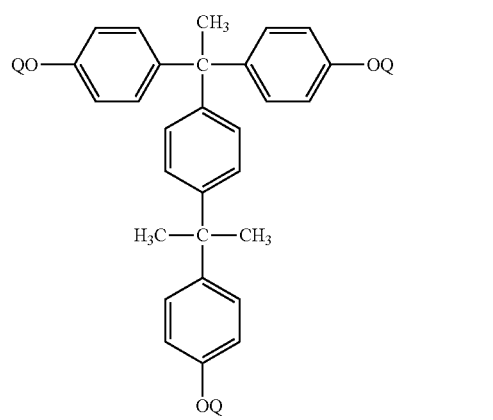

In the above Chemical Formula 28a,
Q is the same as defined in the above Chemical Formula 28, and 67% of Q is substituted with the above Chemical Formula 29a.

[Chemical Formula 55]

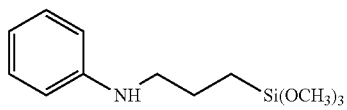

Example 2

A positive photosensitive resin composition is obtained through the same process as in Example 1, except that 1.5 g of the phenol compound obtained in Synthesis Example 2 is used instead of the phenol compound obtained in Synthesis Example 1.

Example 3

A positive photosensitive resin composition is obtained through the same process as in Example 1, except that 1.5 g of the phenol compound obtained in Synthesis Example 3 is used instead of the phenol compound obtained in Synthesis Example 1.

Example 4

A positive photosensitive resin composition is obtained through the same process as in Example 1, except that 1.5 g of the phenol compound obtained in Synthesis Example 4 is used instead of the phenol compound obtained in Synthesis Example 1.

Example 5

15 g of the polybenzoxazole precursor (PBO-2) obtained from Synthesis Example 6 is added to and dissolved in 35.0 g of γ-butyrolactone (GBL). Then, 3 g of photosensitive diazoquinone shown in Chemical Formula 28a, 0.75 g of trimethoxy[3-(phenylamino)propyl]silane shown in the following Chemical Formula 55 as a silane coupling agent, and 1.5 g of the phenol compound obtained in the Synthesis Example 1 are added thereto and dissolved therein. Subsequently, the mixture solution is filtered by a 0.45-μm fluorine resin filter to thereby produce a positive photosensitive resin composition.

Example 6

A positive photosensitive resin composition is obtained through the same process as in Example 5, except that 1.5 g of the phenol compound obtained in Synthesis Example 2 is used instead of the phenol compound obtained in Synthesis Example 1.

Example 7

A positive photosensitive resin composition is obtained through the same process as in Example 5, except that 1.5 g of the phenol compound obtained in Synthesis Example 3 is used instead of the phenol compound obtained in Synthesis Example 1.

Example 8

A positive photosensitive resin composition is obtained through the same process as in Example 5, except that 1.5 g of the phenol compound obtained in Synthesis Example 4 is used instead of the phenol compound obtained in Synthesis Example 1.

Comparative Example 1

A positive photosensitive resin composition is obtained through the same process as in Example 1, except that 1.5 g of the phenol compound [P-5] represented by the following Chemical Formula 56 is used instead of the phenol compound obtained in Synthesis Example 1.

[Chemical Formula 56]

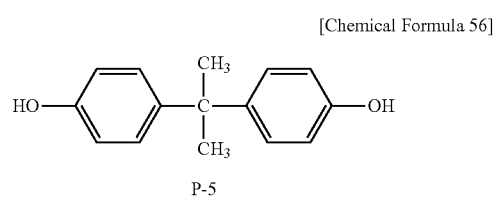

P-5

Comparative Example 2

A positive photosensitive resin composition is obtained through the same process as in Example 5, except that 1.5 g of the phenol compound [P-5] represented by the above Chemical Formula 56 is used instead of the phenol compound obtained in Synthesis Example 1.

Comparative Example 3

A positive photosensitive resin composition is obtained through the same process as in Example 1, except that 1.5 g of the phenol compound [P-6] represented by the following Chemical Formula 57 is used instead of the phenol compound obtained in Synthesis Example 1.

[Chemical Formula 57]

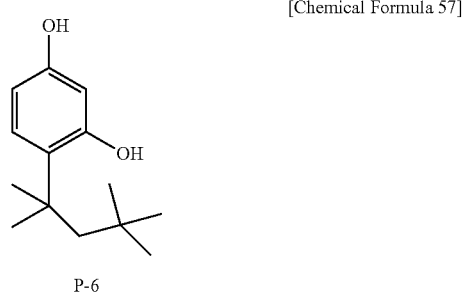

P-6

Comparative Example 4

A positive photosensitive resin composition is obtained through the same process as in Example 5, except that 1.5 g of the phenol compound [P-6] represented by the above Chemical Formula 57 is used instead of the phenol compound obtained in Synthesis Example 1.

Each component of the positive photosensitive resin compositions according to Examples 1 to 8 and Comparative Examples 1 to 4 is shown in the following Table 1.

TABLE 1

| | Polybenzoxazole precursor | | Solvent | | Photosensitive diazoquinone compound | | Silane compound | | Phenol compound | |
|---|---|---|---|---|---|---|---|---|---|---|
| | Kind | Amount (g) | Kind | Amount (g) | Used or not | Amount (g) | Used or not | Amount (g) | Kind | Amount (g) |
| Ex. 1 | PBO-1 | 15 | GBL | 35 | used | 3 | used | 0.75 | P-1 | 1.5 |
| Ex. 2 | PBO-1 | 15 | GBL | 35 | used | 3 | used | 0.75 | P-2 | 1.5 |
| Ex. 3 | PBO-1 | 15 | GBL | 35 | used | 3 | used | 0.75 | P-3 | 1.5 |
| Ex. 4 | PBO-1 | 15 | GBL | 35 | used | 3 | used | 0.75 | P-4 | 1.5 |
| Ex. 5 | PBO-2 | 15 | GBL | 35 | used | 3 | used | 0.75 | P-1 | 1.5 |
| Ex. 6 | PBO-2 | 15 | GBL | 35 | used | 3 | used | 0.75 | P-2 | 1.5 |
| Ex. 7 | PBO-2 | 15 | GBL | 35 | used | 3 | used | 0.75 | P-3 | 1.5 |
| Ex. 8 | PBO-2 | 15 | GBL | 35 | used | 3 | used | 0.75 | P-4 | 1.5 |
| Comp. Ex. 1 | PBO-1 | 15 | GBL | 35 | used | 3 | used | 0.75 | P-5 | 1.5 |
| Comp. Ex. 2 | PBO-2 | 15 | GBL | 35 | used | 3 | used | 0.75 | P-5 | 1.5 |
| Comp. Ex. 3 | PBO-1 | 15 | GBL | 35 | used | 3 | used | 0.75 | P-6 | 1.5 |
| Comp. Ex. 4 | PBO-2 | 15 | GBL | 35 | used | 3 | used | 0.75 | P-6 | 1.5 |

<Estimation Physical Property>

Each positive photosensitive resin composition prepared from Examples 1 to 8 and Comparative Examples 1 to 4 is coated on a 8-inch wafer by a spin coater manufactured by Mikasa (1H-DX2), and then it is heated on a hot plate at 120° C. for 4 minutes to provide a photosensitive polyimide precursor film.

The polyimide precursor film is exposed through a mask having various patterns by an I-line stepper (NSR i10C) manufactured by Japan Nikon for 250 ms, dissolved in a 2.38 wt % tetramethyl ammonium hydroxide aqueous solution at room temperature for 60 seconds (2 puddles) to remove the exposed part, and washed with pure water for 30 seconds. In addition, the obtained pattern is cured in an electric furnace under an oxygen concentration of 1000 ppm or below at 120° C. for 30 minutes and additionally at 320° C. for 1 hour to provide a patterned film.

In order to measure the sensitivity, the optimal exposure time is determined when a 10 µm L/S (line and space) pattern is formed in a line width of 1 to 1, and the resolution is determined as the minimum pattern size at the optimal exposure time. The results are shown in the following Table 2. The resolution is observed through an optical microscope.

Advantageously the amount that the film thickness decreases during development is minimized. In order to measure this, the pre-baked film is immersed in a 2.38 wt % tetramethyl ammonium hydroxide (TMAH) aqueous solution at different times and washed with water, so the change of film thickness is measured to calculate the residual film ratio (thickness after development/thickness before development, unit: %). The results are shown in the following Table 2. The film thickness change after pre-firing, development, and curing is measured by using ST4000-DLX equipment manufactured by KMAC Co.

In order to measure mechanical properties of a cured film, a silicon wafer covered with the cured film is dipped in a 2% HF solution for 30 minutes. Then, the film is separated therefrom and cut to a 6.0 cm×1.0 cm ribbon shape to be used as a specimen. This specimen is used to evaluate elongation by using a multipurpose tester (Instron series IX). The results are shown in the following Table 2.

TABLE 2

| | | Film thickness (µm) | | Residual film ratio (%) | Elongation (%) | Sensitivity (mJ/cm$^2$) | Resolution (µm) |
|---|---|---|---|---|---|---|---|
| | Phenol | Pre-firing | After development | | | | |
| Ex. 1 | P-1 | 11.23 | 9.98 | 88.87 | 48 | 390 | 3 |
| Ex. 2 | P-2 | 11.15 | 9.85 | 88.34 | 39 | 350 | 3 |
| Ex. 3 | P-3 | 11.21 | 10.20 | 90.99 | 52 | 380 | 3 |
| Ex. 4 | P-4 | 11.00 | 9.47 | 86.09 | 46 | 350 | 3 |
| Ex. 5 | P-1 | 11.23 | 9.65 | 85.93 | 67 | 400 | 5 |
| Ex. 6 | P-2 | 11.15 | 9.80 | 87.89 | 48 | 400 | 5 |
| Ex. 7 | P-3 | 11.21 | 9.74 | 86.89 | 51 | 350 | 3 |
| Ex. 8 | P-4 | 11.00 | 9.69 | 88.09 | 60 | 380 | 3 |
| Comp. Ex. 1 | P-5 | 10.80 | 8.50 | 78.70 | 20 | 500 | 5 |
| Comp. Ex. 2 | P-5 | 10.90 | 8.20 | 75.23 | 28 | 510 | 7 |
| Comp. Ex. 3 | P-6 | 11.50 | 8.80 | 76.52 | 12 | 450 | 5 |
| Comp. Ex. 4 | P-6 | 11.10 | 9.00 | 81.08 | 15 | 480 | 5 |

As shown in the Table 2, the positive photosensitive resin compositions of Examples 1 to 8 have a greater residual film ratio than those of Comparative Examples 1 to 4 according to time. Therefore, when the development is carried out with an alkali aqueous solution, it can form a better pattern.

Also, Examples 1 to 8 have excellent sensitivity and mechanical strength such as elongation compared to Comparative Examples 1 to 4. In addition, Examples 1 to 8 have an excellent or the equivalent resolution compared to Comparative Examples 1 to 4.

Although not wishing to be bound by any theory or explanation other invention it is currently believed that forming a cross-linking bond between the cross-linking functional group included in the phenol compound and the thermally polymerizable functional group included in the terminal end of the polybenzoxazole precursor provides the results presented in the foregoing tables.

Referring to the results, the positive photosensitive resin composition according to one embodiment of this disclosure may form a semiconductor insulation layer or protective layer having excellent performance through more effective patterning as compared to a positive photosensitive resin composition including a conventional phenol compound. The semiconductor insulation layer or protective layer fabricated by using the positive photosensitive resin composition according to one embodiment of this disclosure may also exhibit excellent mechanical properties as compared to a semiconductor protective layer fabricated by using a conventional positive photosensitive resin composition.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising:
   (A) a polybenzoxazole precursor including a repeating unit represented by the following Chemical Formula 1, a repeating unit represented by the following Chemical Formula 2, or a combination thereof, and a thermally polymerizable functional group at at least one terminal end of the polybenzoxazole precursor;
   (B) a photosensitive diazoquinone compound;
   (C) a phenol compound including a cross-linking functional group represented by the following Chemical Formula 36 or a combination thereof:

[Chemical Formula 36]

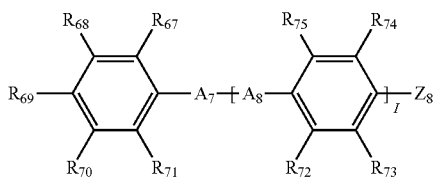

wherein, in the above Chemical Formula 36,
$R_{67}$ to $R_{75}$ are the same or different and independently comprise hydrogen, hydroxyl, alkyl, substituted or unsubstituted aryl, substituted or unsubstituted alkoxy, or halogen, wherein at least one of $R_{67}$ to $R_{75}$ is hydroxyl, $A_7$ and $A_8$ are the same or different and independently comprise O, CO, $CR_{211}R_{212}$, $SO_2$, S, or a single bond, wherein $R_{211}$ and $R_{212}$ are the same or different and independently comprise hydrogen or substituted or unsubstituted alkyl, $Z_8$ comprises a substituted or unsubstituted aromatic organic group comprising an unsaturated bond, a substituted or unsubstituted aliphatic organic group comprising an unsaturated bond, or a substituted or unsubstituted alicyclic organic group comprising an unsaturated bond, and l is an integer ranging from 0 to 3;
(D) a silane compound; and
(E) a solvent:

[Chemical Formula 1]

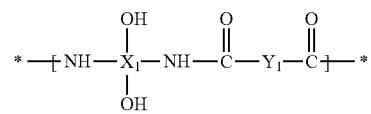

[Chemical Formula 2]

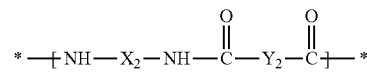

wherein, in the above Chemical Formulae 1 and 2,
$X_1$ comprises an aromatic organic group,
$X_2$ comprises an aromatic organic group, a divalent to hexavalent alicyclic organic group, or a functional group represented by the following Chemical Formula 3, and
$Y_1$ and $Y_2$ are the same or different and independently comprise an aromatic organic group or a divalent to hexavalent alicyclic organic group,

[Chemical Formula 3]

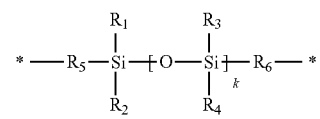

wherein, in the above Chemical Formula 3,
$R_1$ to $R_4$ are the same or different and independently comprise substituted or unsubstituted alkyl, substituted or unsubstituted aryl, substituted or unsubstituted alkoxy, or hydroxyl,
$R_5$ and $R_6$ are the same or different and independently comprise substituted or unsubstituted alkylene or substituted or unsubstituted arylene, and
k is an integer ranging from 1 to 50.

2. The positive photosensitive resin composition of claim 1, wherein the thermally polymerizable functional group is derived from a reactive end-capping monomer comprising a monoamine, monoanhydride, or monocarboxylic acid halide.

3. The positive photosensitive resin composition of claim 2, wherein the monoamine comprises toluidine, dimethylaniline, ethylaniline, aminophenol, aminobenzylalcohol, aminoindan, aminoacetophenone, or a combination thereof.

4. The positive photosensitive resin composition of claim 2, wherein the monoanhydride comprises 5-norbornene-2,3-dicarboxylic anhydride represented by the following Chemical Formula 13, 3,6-epoxy-1,2,3,6-tetrahydrophthalic anhydride represented by the following Chemical Formula 14, isobutenyl succinic anhydride represented by the following Chemical Formula 15, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), or a combination thereof:

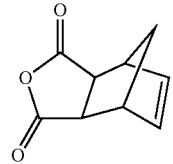
[Chemical Formula 13]

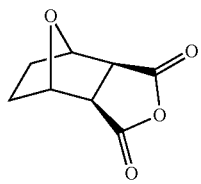
[Chemical Formula 14]

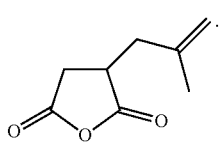
[Chemical Formula 15]

5. The positive photosensitive resin composition of claim 2, wherein the monocarboxylic acid halide is represented by the following Chemical Formula 21, or a combination thereof:

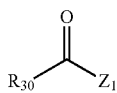
[Chemical Formula 21]

wherein, in the above Chemical Formula 21, $R_{30}$ comprises a substituted or unsubstituted alicyclic organic group or a substituted or unsubstituted aromatic organic group, and $Z_1$ is F, Cl, Br, or I.

6. The positive photosensitive resin composition of claim 5, wherein the monocarboxylic acid halide comprises 5-norbornene-2-carboxylic acid halide represented by the following Chemical Formula 22, 4-nadimido benzoyl halide represented by the following Chemical Formula 23, 4-(4-phenylethynylphthalimido)benzoyl halide represented by the following Chemical Formula 24, 4-(2-phenylmaleicimido) benzoyl halide represented by the following Chemical Formula 25, benzoyl halide represented by the following Chemical Formula 26, cyclohexane carbonyl halide represented by the following Chemical Formula 27, 4-(3-phenylethynylphthalimido)benzoyl halide, 4-maleimidobenzoyl halide, or a combination thereof:

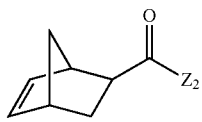
[Chemical Formula 22]

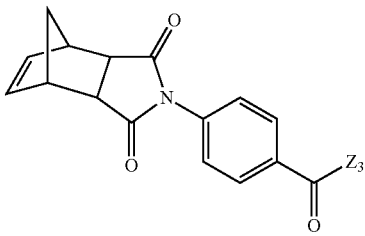
[Chemical Formula 23]

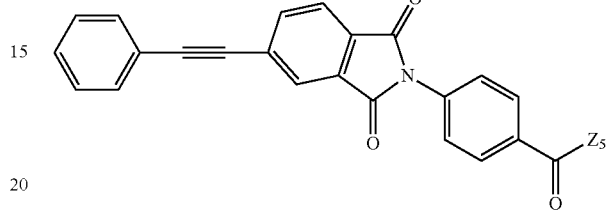
[Chemical Formula 24]

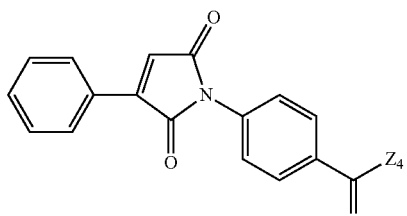
[Chemical Formula 25]

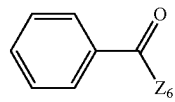
[Chemical Formula 26]

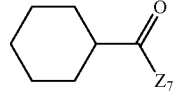
[Chemical Formula 27]

wherein, in the above Chemical Formulae 22 to 27, $Z_2$ to $Z_7$ are the same or different and independently comprise F, Cl, Br, or I.

7. The positive photosensitive resin composition of claim 1, wherein the polybenzoxazole precursor comprises a combination of a repeating unit represented by the above Chemical Formula 1 and a repeating unit represented by the above Chemical Formula 2, and the total amount of a repeating unit represented by the above Chemical Formula 1 and a repeating unit represented by the above Chemical Formula 2 is about 100 mol %, the repeating unit represented by the above Chemical Formula 1 is included in an amount ranging from about 60 mol % to about 95 mol % and the repeating unit represented by the above Chemical Formula 2 is included in an amount ranging from about 5 mol % to about 40 mol %.

8. The positive photosensitive resin composition of claim 1, wherein the polybenzoxazole precursor has a weight average molecular weight (Mw) ranging from about 3000 to about 300,000.

9. The positive photosensitive resin composition of claim 1, wherein $Z_8$ is selected from the group represented by the following Chemical Formulae 37 to 40, or a combination thereof:

[Chemical Formula 37]

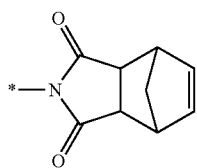

[Chemical Formula 38]

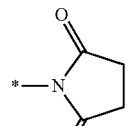

[Chemical Formula 39]

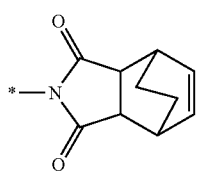

[Chemical Formula 40]

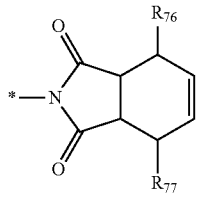

wherein, in the above Chemical Formula 40,
$R_{76}$ and $R_{77}$ are the same or different and independently comprise H or $CH_3$.

10. The positive photosensitive resin composition of claim 1, wherein the phenol compound comprising a cross-linking functional group is represented by the following Chemical Formulae 41 to 48 or a combination thereof:

[Chemical Formula 41]

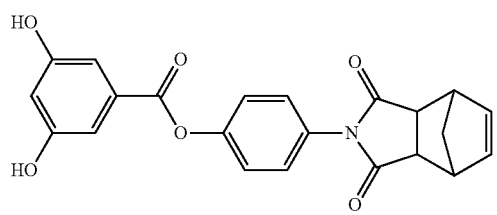

[Chemical Formula 42]

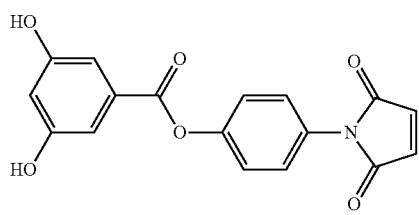

[Chemical Formula 43]

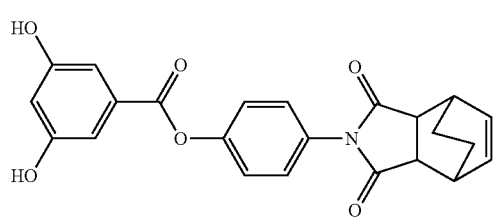

[Chemical Formula 44]

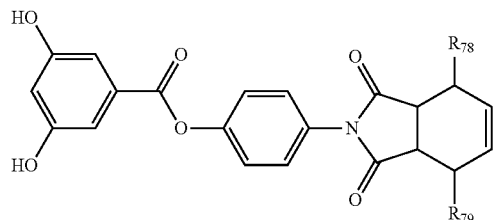

[Chemical Formula 45]

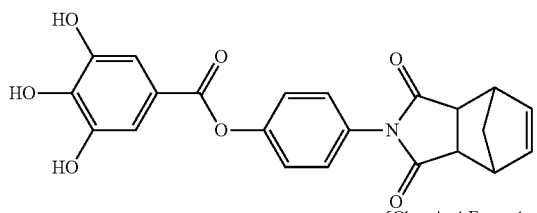

[Chemical Formula 46]

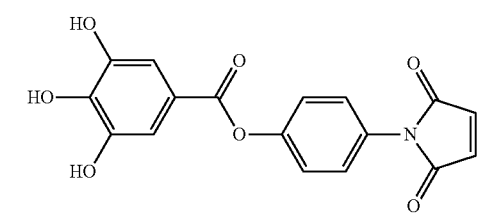

[Chemical Formula 47]

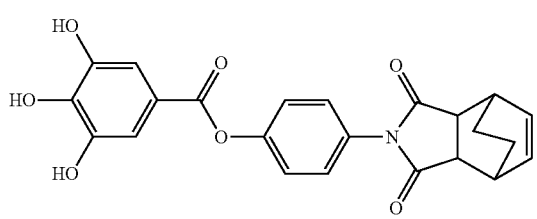

[Chemical Formula 48]

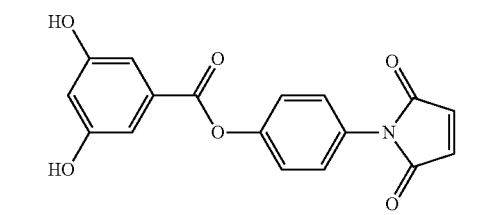

wherein, in the above Chemical Formulae 44 and 48,
$R_{78}$ to $R_{81}$ are the same or different and independently comprise H or $CH_3$.

11. The positive photosensitive resin composition of claim 1, wherein the resin composition comprises,
based on about 100 parts by weight of the polybenzoxazole precursor (A):
about 5 parts to about 100 parts by weight of the photosensitive diazoquinone compound (B);
about 1 parts to about 30 parts by weight of the phenol compound including the cross-linking functional group (C);
about 0.1 parts to about 30 parts by weight of the silane compound (D); and
about 50 parts to about 300 parts by weight of the solvent (E).

12. A photosensitive resin film made using the positive photosensitive resin composition according to claim 1.

13. A semiconductor device comprising the photosensitive resin film according to claim 12.

* * * * *